(12) United States Patent
Chen

(10) Patent No.: US 6,237,222 B1
(45) Date of Patent: May 29, 2001

(54) METHOD OF PRODUCING A RADIATOR AND PRODUCT THEREOF

(76) Inventor: Yun-Ching Chen, N. Rd., Sec. 5, Taipei (TW)

( * ) Notice: Subject to any disclaimer, the term of this patent is extended or adjusted under 35 U.S.C. 154(b) by 0 days.

(21) Appl. No.: 09/312,040

(22) Filed: May 14, 1999

(51) Int. Cl.$^7$ ................................................ B23P 15/26
(52) U.S. Cl. .......................... 29/890.03; 29/890.043; 29/890.039
(58) Field of Search .................... 29/890.03, 890.034, 29/890.043, 890.039, 890.033, 890.07; 165/80.3

(56) References Cited

U.S. PATENT DOCUMENTS

| | | | |
|---|---|---|---|
| 4,746,479 | * 5/1988 | Hanaki et al. | 29/890.03 |
| 5,247,734 | * 9/1993 | Lubbe et al. | 29/890.045 |
| 5,533,257 | * 7/1996 | romero et al. | 165/80.3 |
| 6,134,783 | * 10/2000 | Bargman et al. | 29/890.03 |
| 6,138,352 | * 10/2000 | Smith et al. | 29/890.03 |

* cited by examiner

*Primary Examiner*—I Cuda Rosenbaum
(74) *Attorney, Agent, or Firm*—Pro-Techtor International Services

(57) ABSTRACT

A method for producing a radiator mainly including the steps of forming a base, forming a radiator fin, forming a foundation plate, and assembling the radiator fin, the foundation plate and the base to form a radiator. The radiator produced in the above method has simple structure and reduced weight and can therefore be quickly assembled at lowered production cost.

4 Claims, 10 Drawing Sheets

METHOD OF PRODUCING A RADIATOR AND PRODUCT THEREOF

BACKGROUND OF THE INVENTION

The present invention relates to a method of producing a radiator and product thereof, and more particularly to a method for easily forming a radiator at lowered production cost and product thereof.

A conventional radiator is usually integrally formed from extruded aluminum and requires considerably high production cost. Meanwhile, the aluminum material has high regeneration performance and is therefore not an absolutely good material for superior heat radiation and temperature drop. To improve drawbacks existing in the conventional extruded aluminum radiator, there is built-up radiator developed. Taiwanese Patent Publication No. 339865 entitled "A Radiator" discloses a built-up radiator including a base 1, a radiating main body 2, and a top cover 3. Assembled and exploded perspective views of the radiator are shown in FIGS. 11 and 12, respectively. The base 1 is a thin plate made of aluminum and has upward extended front and rear edges 11 both that are provided with two retaining notches 111. The radiating main body 2 is formed by continuously bending a plurality of aluminum sheets, so that each of the aluminum sheets includes a plurality of hollow grids 21. The grids 21 located at two outer ends of each bent aluminum sheet have an outward extended leg 211 each. The top cover 3 is made of aluminum sheet and has an n-shaped cross section. Front and rear vertical walls of the top cover 3 are provided at their surfaces with two openings 31 corresponding to the notches 111 on the base 1, and at their lower edges with an inward bent lip 32 each. The top cover 3 is also provided at a top surface thereof with a central window 33. Four through holes 331 are separately provided on the top surface of the top cover 3 near four corners of the window 33. The radiating main body 2 is welded or glued to an upper surface of the base 1 with an adequate clearance left between the legs 211 and the upward front and rear edges 11 of the base 1. The top cover 3 is located above the radiating main body 2 to house the same. The lips 32 at the lower edges of the top cover 3 are located below the legs 211 of the radiating main body 2, and the lower edges of the top cover 3 are prevented from moving by the upward front and rear edges 11 of the base 1.

Following are some disadvantages existing in the above-described conventional built-up radiator:

1. The radiating main body 2 must be attached to the base 1 before the top cover 3 can be covered onto the radiating main body 2. It necessitates an increased clearance left between the legs 211 and the edges 11 to allow easy assembling of the top cover 3 to house the radiating main body 2. The increased clearance will, however, cause easily loosened or even separated top cover 3 from the whole radiator.
2. It is uneasy and therefore takes considerable time to mount the top cover 3 onto the base 1 for housing the radiating main body 2. Cost for the conventional built-up radiator is therefore high.
3. The base 1, the radiating main body 2 and the top cover 3 all have complicate structure. The upward front and rear edges 11 and the retaining notches 111 of the base 1 and the bent hollow grids 21 and the legs 211 of the radiating main body 2 all are difficult to form. The conventional built-up radiator therefore requires high manufacturing cost while the productivity thereof is low.
4. The top cover 3 is provided mainly for mounting a cooling fan thereto and is not made of thermal conductive material. It does not radiating heat and is therefore a superfluous member in the radiator.
5. The top cover 3 makes the radiator bulky and heavy.

It is therefore tried by the inventor to simplify the manufacturing process for the conventional built-up radiator and develop a method for easily forming a built-up radiator at reduced production cost.

SUMMARY OF THE INVENTION

A primary object of the present invention is to provide a method for producing a radiator that can be quickly assembled to reduce production cost thereof.

Another object of the present invention is to provide a radiator that has simple structure and reduced weight and can be easily assembled to increase productivity.

The method of producing a radiator according to the present invention includes the steps of forming a base, forming a radiator fin, associating the radiator fin with the base, forming a foundation plate, and assembling the foundation plate to an underside of the base.

The step of forming a base includes cutting a thermal conductive material to form a U-shaped base, punching a bottom of the base to form a plurality of parallel linear slots, and forming a flat recess below the bottom of the base.

The step of forming a radiator fin includes cutting a thermal conductive material to form a belt having a width equal to the length of the linear slot formed on the bottom of the base, and punching the belt material to form a plurality of fins.

The step of associating the radiator fin with the base includes locating the radiator fin below the base and aligning the fins with the linear slots on the base, and pushing the radiator fin upward for the fins to pass through the linear slots and project from the bottom of the base.

The step of forming a foundation plate provides a plate having dimensions suitable for setting in the bottom recess of the base.

The step of assembling the foundation plate to the base includes positioning the foundation plate below the radiator fin that has been associated with the base, and firmly setting the foundation plate in the flat recess at underside of the bottom of the base.

A radiator produced in the above method of the present invention mainly includes a base, a radiator fin, and a foundation plate.

The base has a U-shaped cross section and includes a bottom and two upward side walls. The bottom has a plurality of parallel linear slots provided thereon. The two side walls have extended lower ends slightly projected from the bottom to define a flat recess at an underside of the bottom.

The radiator fin is formed from a punched belt material and includes a plurality of fins pointed upward. The fins are spaced and have thickness and length corresponding to the parallel linear slots on the bottom of the base, so that the radiator fin may be upward associated with the base with the fins separately located in the linear slots.

The foundation plate is a flat plate adapted to firmly and fixedly set in the flat recess below the bottom of the base for supporting a bottom of the radiator fin.

BRIEF DESCRIPTION OF THE DRAWINGS

The objects and the features and effect of the present invention may be best understood by referring to the following detailed description of the preferred embodiments and the accompanying drawings, wherein.

DETAILED DESCRIPTION OF THE PREFERRED EMBODIMENTS

Figure 1:
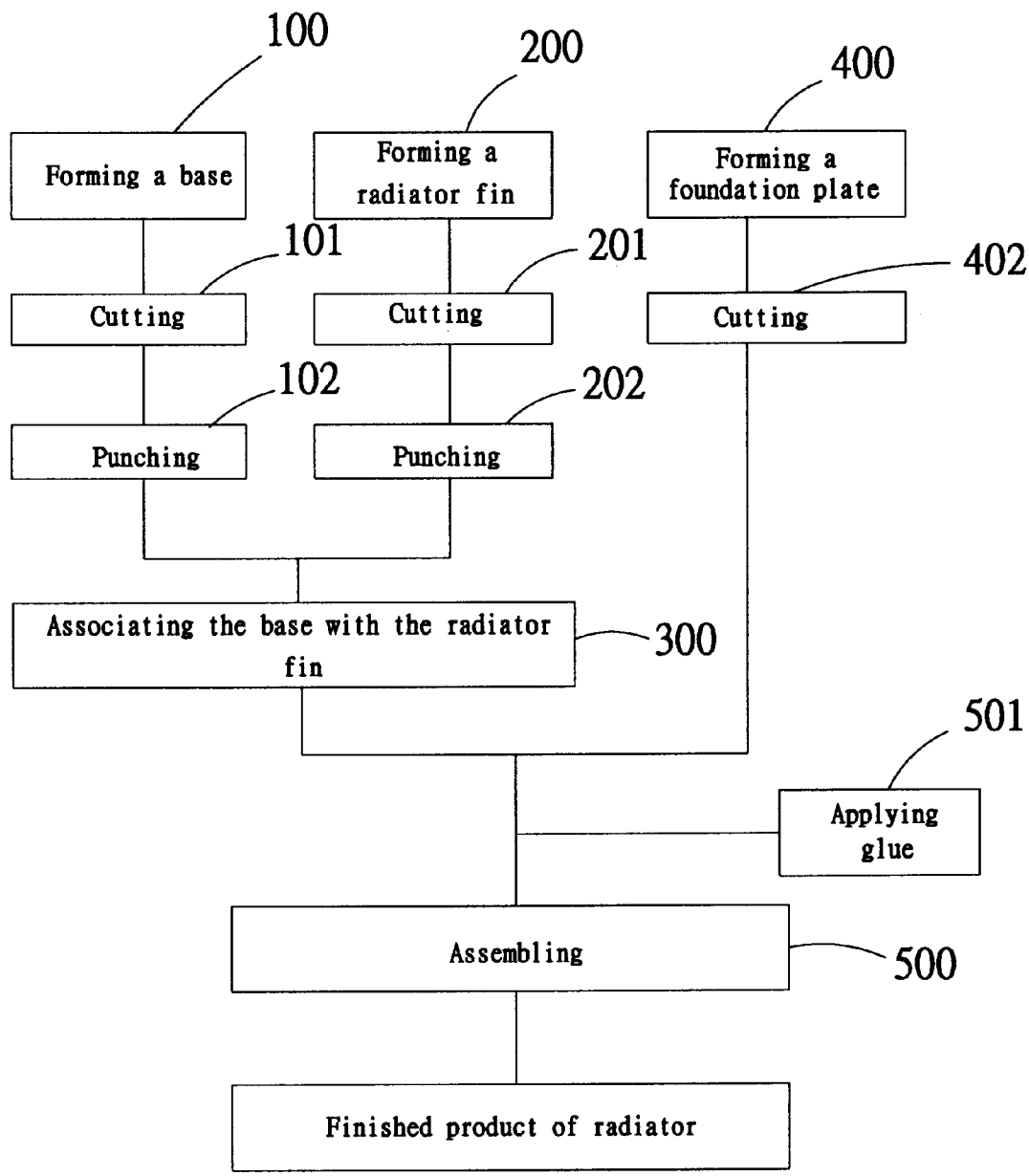
FIG. 1 is a flow chart illustrating a method of producing a radiator according to the present invention.

Please refer to FIG. 1 that is a flow chart illustrating a method for producing a radiator according to the present invention. As shown in FIG. 1, the method mainly includes the steps of forming a base (100), forming a radiator fin (200), associating the radiator fin with the base (300), forming a foundation plate (400), and assembling the foundation plate to an underside of the base (500).

The step of forming a base (100) includes cutting a thermal conductive material to form a U-shaped base (101), punching a bottom of the base to form a plurality of parallel linear slots (102), and forming a flat recess below the bottom of the base (103).

The step of forming a radiator fin (200) includes cutting a thermal conductive material to form a belt having a width equal to the length of the linear slot formed on the bottom of the base (201), and punching the belt material to form a plurality of continuous fins (202).

The step of associating the radiator fin with the base (300) includes locating the radiator fin below the base and aligning the fins with the linear slots on the base, and pushing the radiator fin upward for the fins to pass through the linear slots and project from the bottom of the base.

The step of forming a foundation plate (400) includes cutting of a plate into dimensions suitable for setting in the bottom recess of the base (401).

The step of assembling the foundation plate to the base (500) includes positioning the foundation plate below the radiator fin that has been associated with the base, and firmly setting the foundation plate in the flat recess at underside of the bottom of the base. Glue or adhesive is optionally applied on a top surface of the foundation plate contacting with the radiator fin (501), so as to strengthen the assembling thereof.

Figure 2:
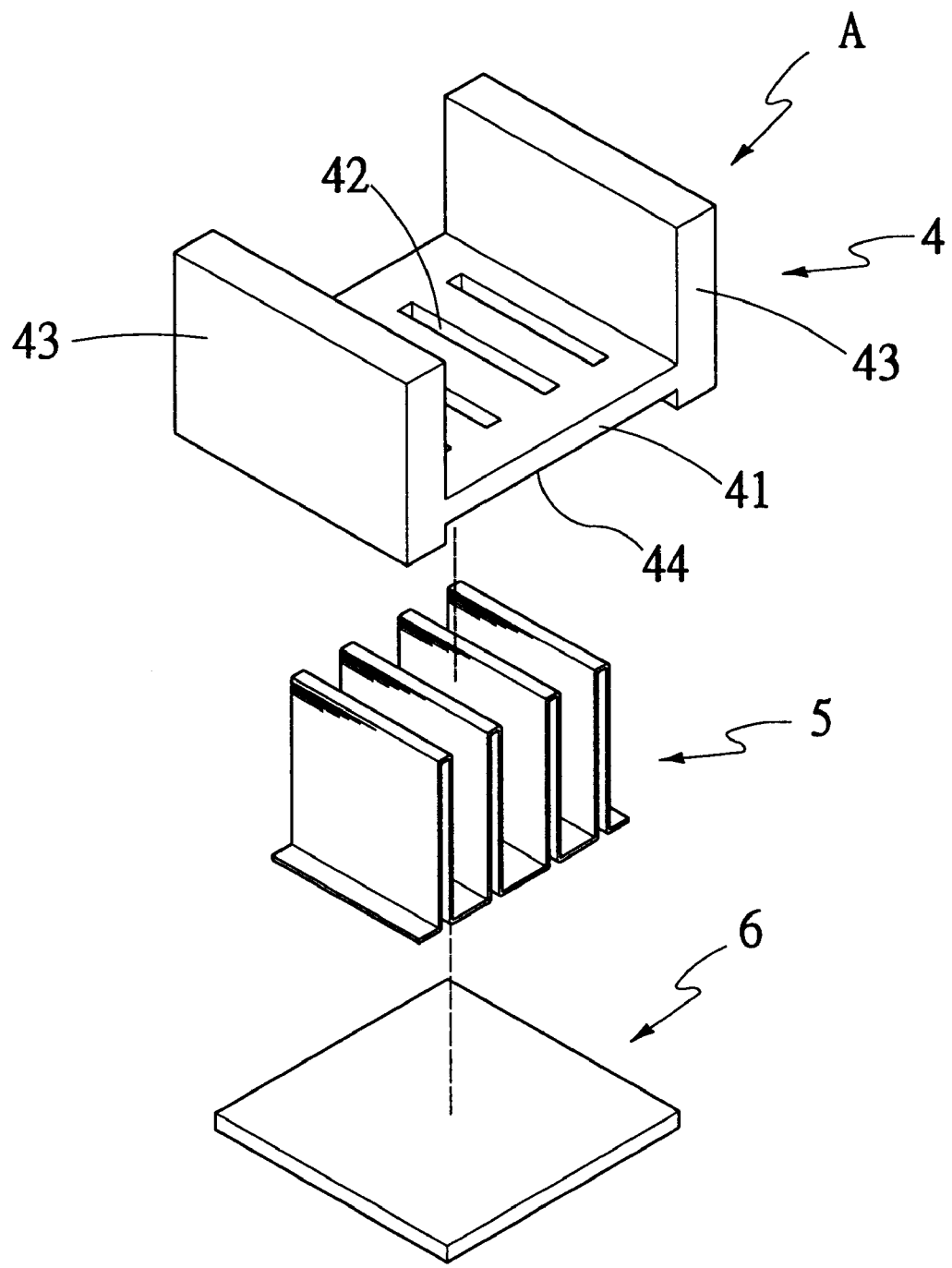
FIG. 2 is an exploded perspective of a radiator produced in the method of FIG. 1.

FIG. 2 is an exploded perspective of a radiator A produced in the above method of the present invention. As shown in the radiator A mainly includes a base 4, a radiator fin 5, and a foundation plate 6.

The base 4 has a U-shaped cross section and includes a bottom 41 and two upward side walls 43. The bottom 41 has a plurality of parallel linear slots 42 provided thereon. The two side walls 43 have extended lower ends slightly projected from the bottom 41 to define a flat recess 44 at an underside of the bottom 41.

The radiator fin 5 is formed from a punched belt material and includes a plurality of fins 5 pointed upward. The fins 5 are spaced and have thickness and length corresponding to the parallel linear slots 42 on the bottom 41 of the base 4, so that the radiator fin 5 may be upward associated with the base 4 with the fins 5 separately located in the linear slots 42.

The foundation plate 6 is a flat plate adapted to firmly and fixedly set in the flat recess 44 below the bottom 41 of the base 4 for supporting a bottom of the radiator fin 5.

Figure 3:
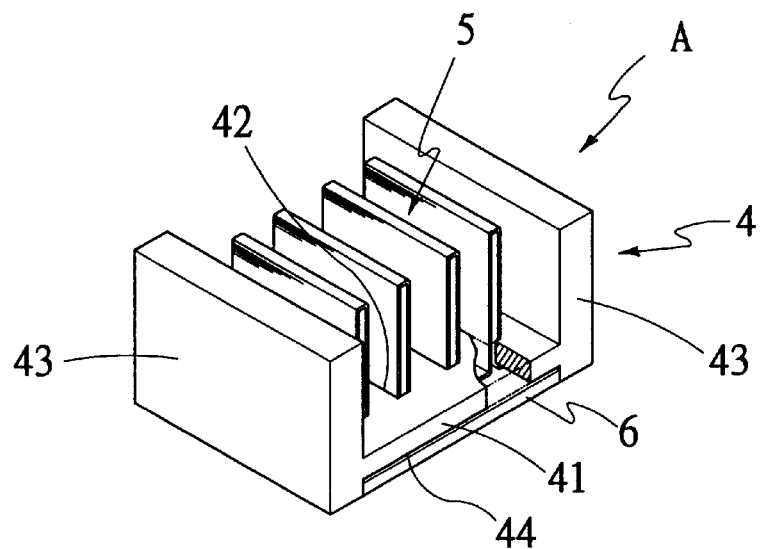
FIG. 3 is an assembled perspective of the radiator of FIG. 2.
Figure 4:
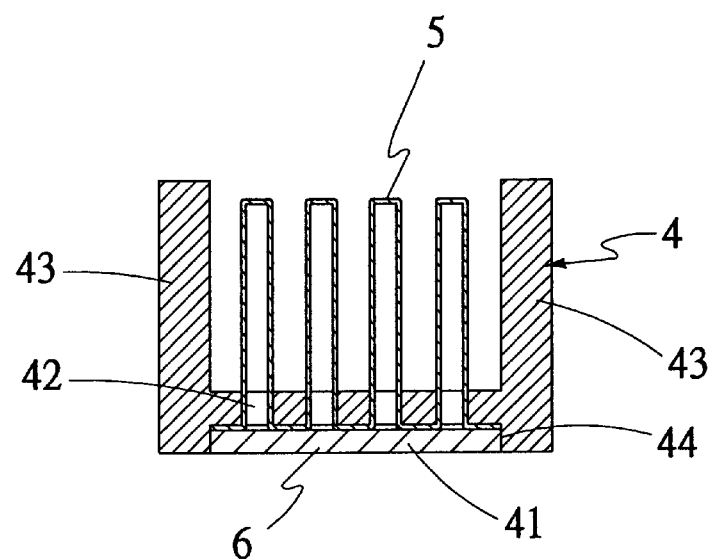
FIG. 4 is a sectional view of the radiator of FIG. 3.

The fins 5 of the radiator fin 5 are upward extended through and located in the linear slots 42 from an underside of the bottom 41 of the base 4, and the foundation plate 6 is set in the flat recess 44 below the radiator fin 5 to support the radiator f in 5 and tightly press it against the underside of the bottom 41, as shown in FIGS. 3 and 4.

Following are some features and advantages of the above-de scribed method for producing a radiator and the product thereof:

1. There are reduced steps and simplified movements included in the method to assemble the radiator, the radiator can therefore be produced at shortened time and lowered cost.
2. The radiator fin 5 may be selected from any suitable thermal conductive material.
3. The radiator has simplified structure and reduced weight. The production thereof is quickly and can be easily controlled in quality.
4. The radiator fin 5 may be produced to different heights depending on actual need. To cooperate with a radiator fin 5 having increased height, the base 4 may be designed to have two layers of bottom 41 to increase contact area with the radiator fin 5.

Figure 5:
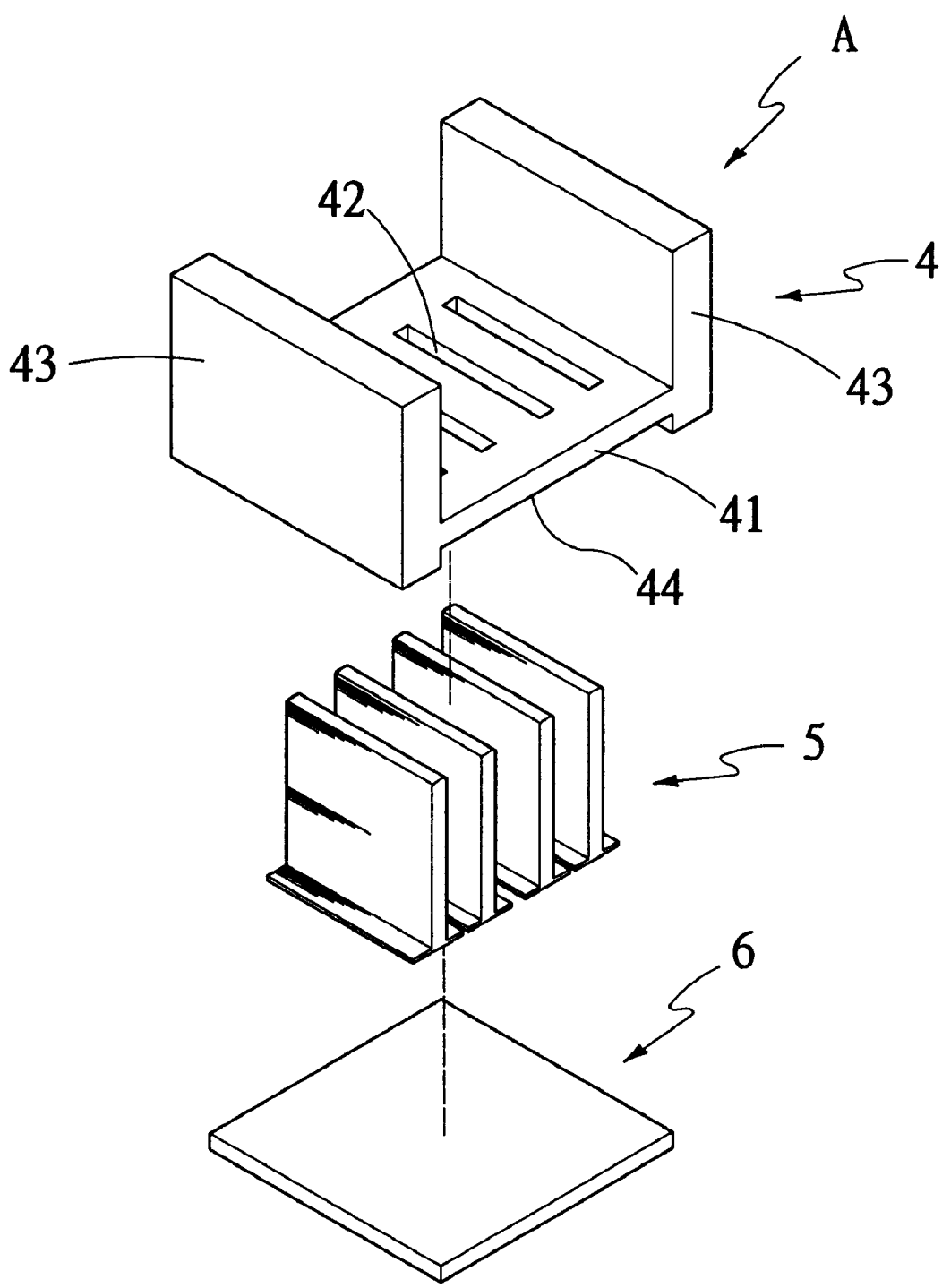
FIG. 5 is an exploded perspective of a radiator of the present invention having a radiator fin structurally different from that shown in FIG. 2.
Figure 6:
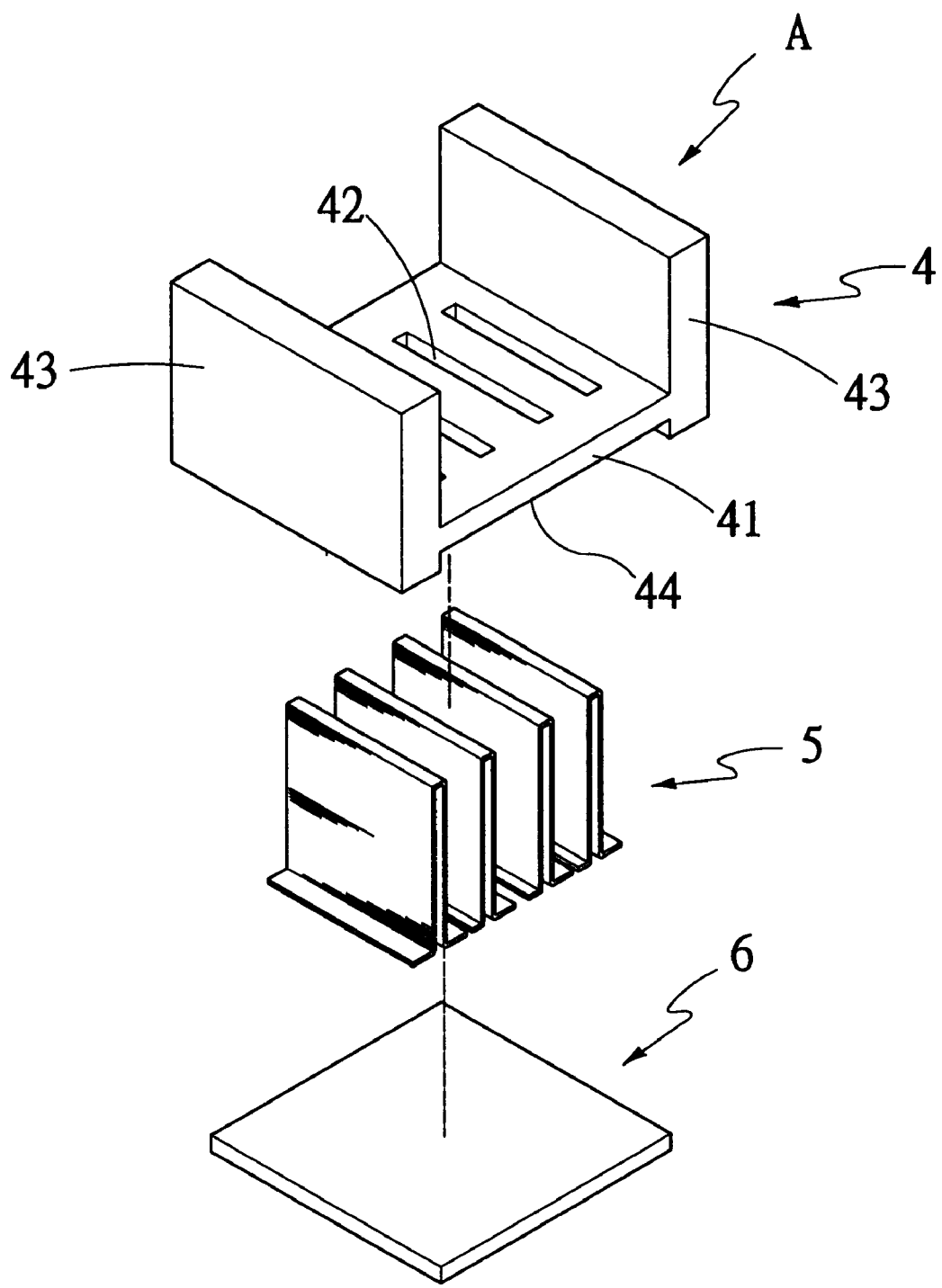
FIG. 6 is an exploded perspective of a radiator of the present invention having a radiator fin structurally different from that shown in FIGS. 2 and 5.

It is to be noted the radiator fin 5 is not necessarily to be in the form of a plurality of continuous fins 5. The radiator fin 5 may also optionally includes a plurality of separated fins 5 in the shape of a reversed letter T or having an n-shaped cross section with two laterally extended legs, as shown in FIGS. 5 and 6, respectively.

What is to be noted is the form of the present invention shown and disclosed is to be taken as a preferred embodiment of the invention and that various changes in the shape, size, and arrangements of parts may be resorted to without departing from the spirit of the invention or the scope of the subjoined claims. For instance, the above-described method may also be modified to have the steps as shown in FIG. 7.

Figure 7:
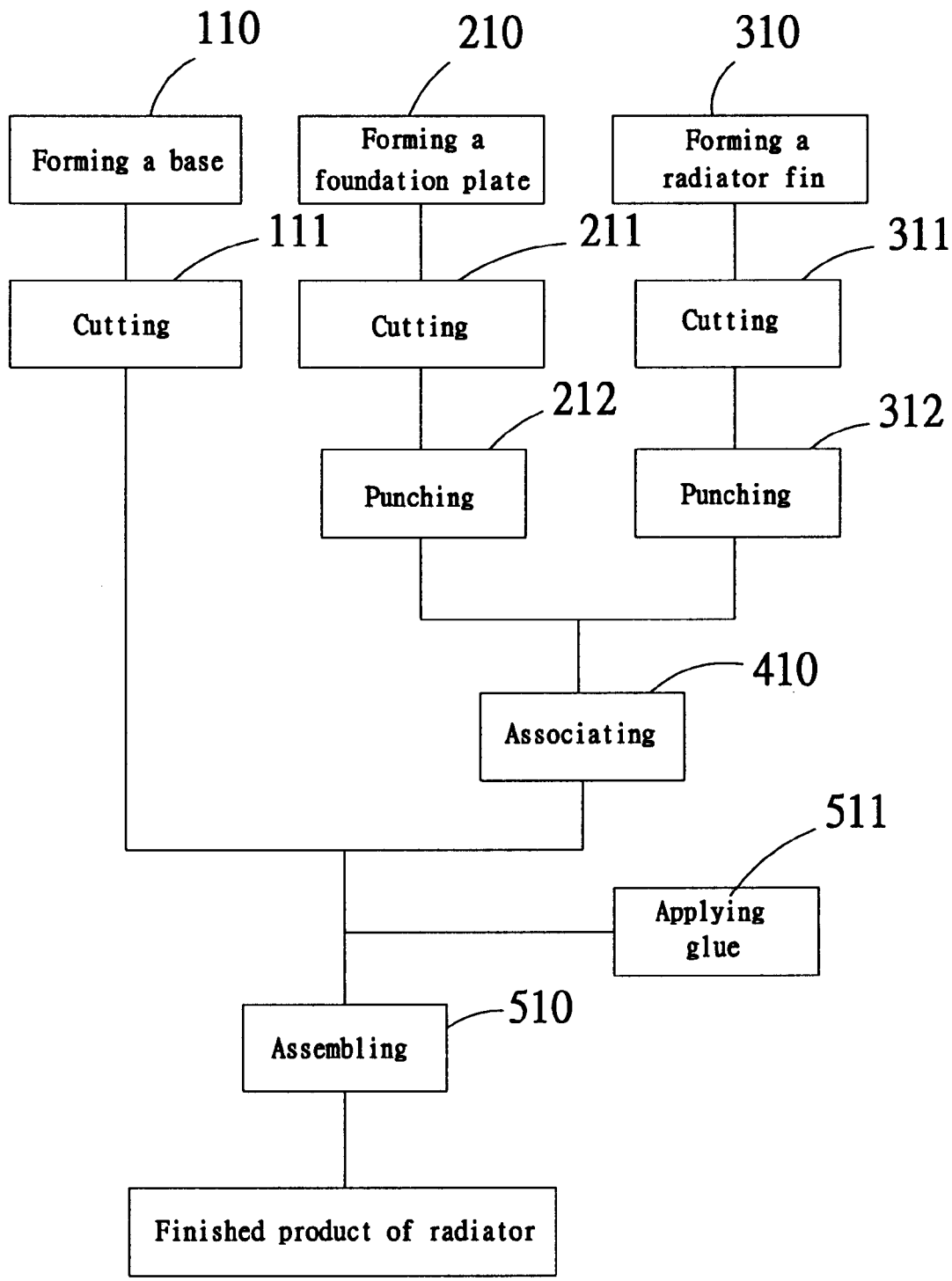
FIG. 7 is a flow chart of another method of producing a radiator according to the present invention.

In FIG. 7, the modified method of the present invention includes steps of forming a base (110), forming a foundation plate (210), forming a radiator fin (310), associating the radiator fin with the foundation plate (410), and assembling the associated foundation plate and radiation fin to the base (510).

The step of forming a base (110) includes cutting a thermal conductive material to form a U-shaped base (111).

The step of forming a foundation plate (210) includes cutting a plate into dimensions suitable for setting in a U-shaped space defined by the base formed in the above step (211), and punching the foundation plate to form a plurality of parallel linear slots thereon (212).

The step of forming a radiator fin (310) includes cutting a thermal conductive material to form a belt having a width equal to the length of the linear slot formed on the foundation plate (311), and punching the belt material to form a plurality of continuous fins (312).

The step of associating the radiator fin with the foundation plate (410) includes locating the radiator fin below the foundation plate and aligning the fins with the linear slots on the foundation plate, and pushing the radiator fin upward for the fins to pass through the linear slots and project from the foundation plate.

The step of assembling the associated foundation plate and radiator fin to the base (510) includes positioning the foundation plate and the associated radiator fin onto the U-shaped base and firmly setting the foundation plate in the U-shaped space of the base. Glue or adhesive may be optionally applied over surfaces of the foundation plate to enhance connection of the radiator fin to the foundation plate and of the foundation plate to the base (511).

Figure 8:
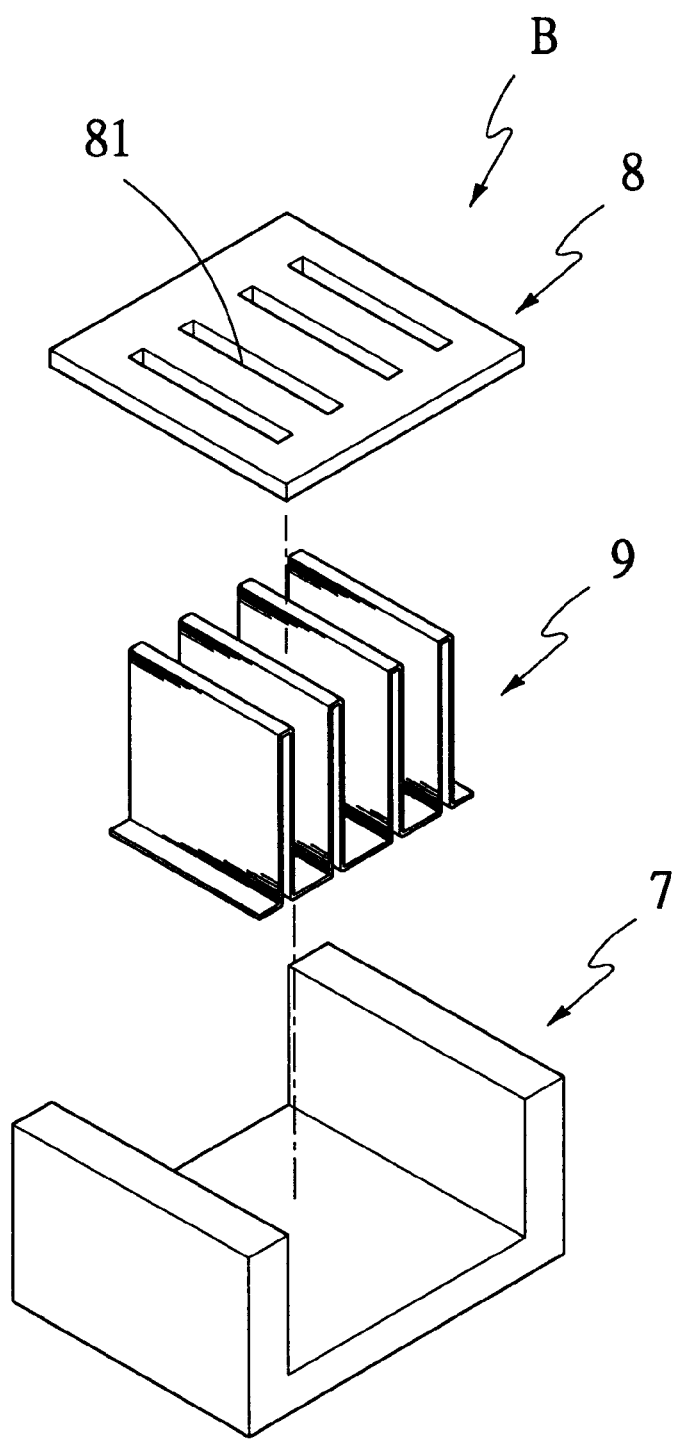
FIG. 8 is an exploded perspective of a radiator produced in the method of FIG. 7.

FIG. 8 is an exploded perspective of a radiator B produced in the modified method of the present invention shown in FIG. 7. As shown, the radiator B mainly includes a base 7, a foundation plate 8, and a radiator fin 9.

The base 7 has a U-shaped cross section defining a U-shaped space.

The foundation plate 8 is a flat plate adapted to firmly and fixedly set in the U-shaped space of the base 7. And there are a plurality of parallel linear slots 81 provided on the foundation plate 8.

The radiator fin 9 is formed from a punched belt material and includes a plurality of continuous fins 9 pointed upward. The fins 9 are spaced and have thickness and length corresponding to the parallel linear slots 81 on the foundation plate 8, so that the radiator fin 9 may be upward associated with the foundation plate 8 with the fins 9 separately located in the linear slots 81.

Figure 9:
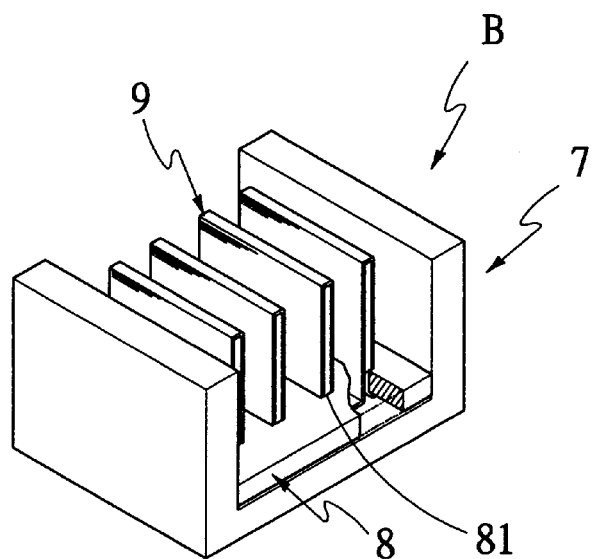
FIG. 9 is an assembled perspective of the radiator of FIG. 8.
Figure 10:
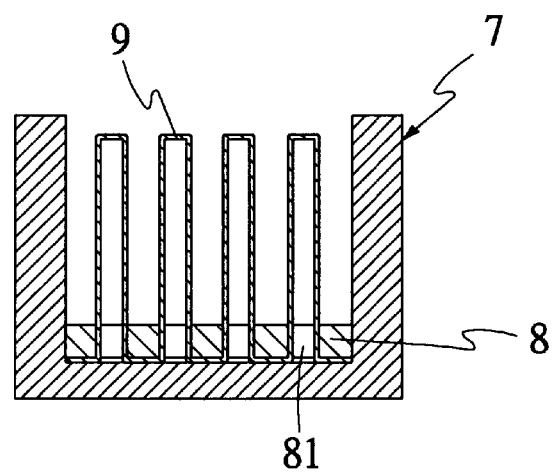
FIG. 10 is a sectional view of the radiator of FIG. 9.
Figure 11:
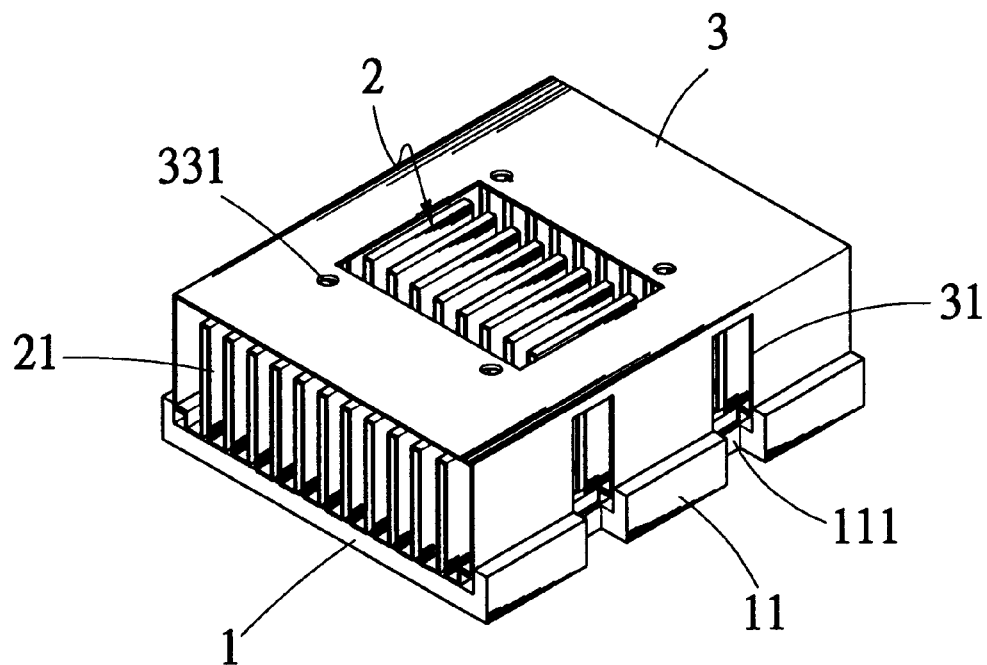
FIG. 11 is an assembled perspective of a conventional built-up radiator.
Figure 12:
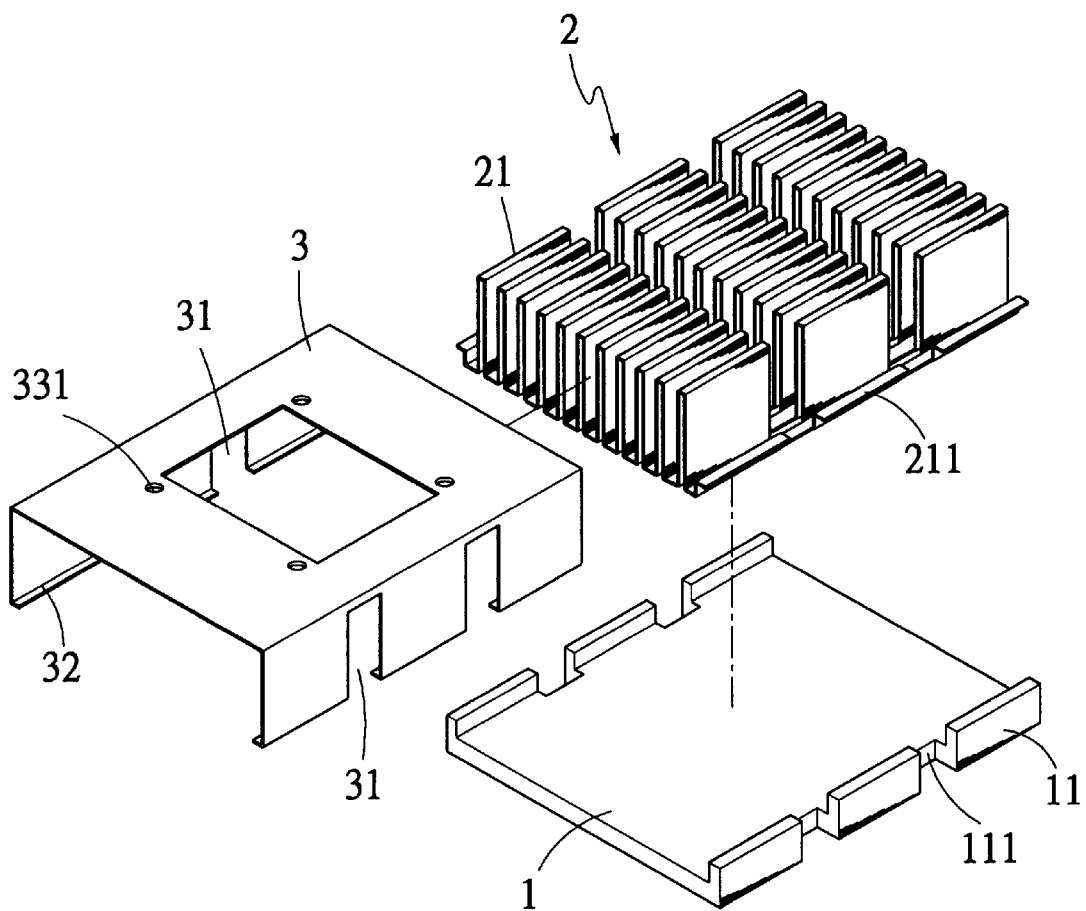
FIG. 12 is an exploded perspective of the conventional built-up radiator of FIG. 11.

The fins 9 of radiator fin 9 are upward extended through and located in the linear slots 81 from an underside of the foundation plate 8, and the foundation plate 8 with the radiator fin 9 associated therewith is firmly set in the U-shaped space of the base 7, as shown in FIGS. 9 and 10. The radiator fin 9 is therefore tightly pressed against the base 7 by the foundation plate 8.

It is to be noted the radiator fin 9 is not necessarily to be in the form of a plurality of continuous fins 9. The radiator fin 9 may also optionally includes a plurality of separated fins 9 in the shape of a reversed letter T or having an n-shaped cross section with two laterally extended legs, similar to the radiator fins 5 shown in FIGS. 5 and 6, respectively.

What is claimed is:

1. A method of producing a radiator, comprising the steps of forming a base, forming a radiator fin, associating said radiator fin with said base, forming a foundation plate, and assembling said foundation plate to an underside of said base;

said step of forming a base including cutting a thermal conductive material to form a U-shaped base, punching a bottom of said base to form a plurality of parallel linear slots, and forming a flat recess below said bottom of said base;

said step of forming a radiator fin including cutting a thermal conductive material to form a belt having a width equal to the length of said linear slot formed on said bottom of said base, and punching said belt material to form a plurality of fins;

said step of associating said radiator fin with said base including locating said radiator fin below said base and aligning said fins with said linear slots on said base, and pushing said radiator fin upward for said fins to pass through said linear slots and project from said bottom of said base;

said step of forming a foundation plate including cutting a plate into dimensions suitable for setting in said bottom recess of said base; and said step of assembling said foundation plate to said base including positioning said foundation plate below said radiator fin that has been associated with said base, and firmly setting said foundation plate in said flat recess at underside of said bottom of said base.

2. A method of producing a radiator as claimed in claim 1, wherein the step of assembling the foundation plate to the base further comprises a step of applying glue or adhesive on surfaces of said foundation plate to strengthen connections of said foundation plate to said radiator fin and to said bottom of said base.

3. A method of producing a radiator, comprising the steps of forming a base, forming a foundation plate, forming a radiator fin, associating said radiator fin with said foundation plate, and assembling said foundation plate to said base;

said step of forming a base including cutting a thermal conductive material to form a U-shaped base;

said step of forming a foundation plate including cutting a plate into dimensions suitable for setting in a U-shaped space defined by said base formed in the above step, and punching said foundation plate to form a plurality of parallel linear slots thereon;

said step of forming a radiator fin including cutting a thermal conductive material to form a belt having a width equal to a length of said linear slot formed on said foundation plate, and punching said belt material to form a plurality of fins;

said step of associating said radiator fin with said foundation plate including locating said radiator fin below said foundation plate and aligning said fins on said radiator fin with said linear slots on said foundation plate, and pushing said radiator fin upward for said fins to pass through said linear slots and project from said foundation plate; and said step of assembling said associated foundation plate and radiator fin to said base including positioning said foundation plate and said radiator fin associated with said foundation plate onto said U-shaped base and firmly setting said foundation plate in said U-shaped space of said base.

4. A method of producing a radiator as claimed in claim 3, wherein the step of assembling said foundation plate and said radiator fin to said base further comprises a step of applying glue or adhesive on surfaces of said foundation plate to strengthen connections of said foundation plate to said radiator fin and to said bottom of said base.

* * * * *